(12) United States Patent
Tsai et al.

(10) Patent No.: US 7,934,968 B2
(45) Date of Patent: May 3, 2011

(54) METHOD OF FABRICATING PIXEL STRUCTURE

(75) Inventors: Tze-Chien Tsai, Hsin-Chu (TW); Ting-Wen Wu, Hsin-Chu (TW); Li-Wei Shih, Hsin-Chu (TW); Ching-Ian Chao, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/699,887

(22) Filed: Feb. 4, 2010

(65) Prior Publication Data

US 2010/0136221 A1    Jun. 3, 2010

Related U.S. Application Data

(62) Division of application No. 11/469,464, filed on Aug. 31, 2006, now Pat. No. 7,755,266.

(30) Foreign Application Priority Data

Jun. 30, 2006 (TW) .............................. 95123813 A (51) Int. Cl.
*H01J 9/00* (2006.01)
(52) U.S. Cl. ............................... 445/24; 427/66; 427/69
(58) Field of Classification Search ............. 445/23–25; 427/66, 69; 313/483, 484, 503, 582
See application file for complete search history.

(56) References Cited

U.S. PATENT DOCUMENTS

| 6,433,486 B1 | 8/2002 | Yokoyama |
| 6,690,118 B2 * | 2/2004 | Yokoyama ................. 315/169.3 |
| 2002/0070909 A1 | 6/2002 | Asano |
| 2005/0151462 A1 * | 7/2005 | Miyagawa .................... 313/500 |
| 2006/0132668 A1 | 6/2006 | Park |
| 2006/0170339 A1 | 8/2006 | Kanno |

FOREIGN PATENT DOCUMENTS

| CN | 1753588 A | 3/2006 |
| CN | 1779766 A | 5/2006 |
| JP | 2004207126 | 7/2004 |
| TW | 493782 | 7/2002 |
| TW | 549517 | 8/2003 |
| TW | 589601 | 6/2004 |
| TW | 200606769 | 2/2006 |

* cited by examiner

*Primary Examiner* — Joseph L Williams
*Assistant Examiner* — Andrew J Coughlin
(74) *Attorney, Agent, or Firm* — Winston Hsu; Scott Margo (57) ABSTRACT

A method of fabricating a pixel structure for use in an electroluminescent panel includes the following steps. A substrate is provided. Three shadow masks having a plurality of first, second, and third openings patterned in an array of T shaped are respectively provided, and three evaporation processes using the three shadow masks are subsequently performed to form a plurality of first subpixel units, second subpixel units and third subpixel units respectively. One first subpixel of the first subpixel unit, one second subpixel of the second subpixel unit adjacent to the first subpixel unit, and one third subpixel of the third subpixel unit adjacent to the first subpixel unit form a display pixel unit.

4 Claims, 10 Drawing Sheets

METHOD OF FABRICATING PIXEL STRUCTURE

CROSS REFERENCE TO RELATED APPLICATIONS

This application is a division of application Ser. No. 11/469,464 filed on Aug. 31, 2006.

BACKGROUND OF THE INVENTION

1. Field of the Invention

The present invention relates to pixel structures for use in electroluminescent panels, and more particularly, to a pixel structure having high precision and a related fabrication method.

2. Description of the Prior Art

An electroluminescent display, such as an organic light emitting diode (OLED) display, is growing in popularity as a mainstream type of thin, flat display, due to characteristics of small size, high resolution, high contrast ratio, low power consumption and active luminescence.

A color image frame of the electroluminescent display is primarily provided by a plurality of display pixels comprising red, green and blue subpixels, and the color image frame is composed of different combinations of grey level color values displayed by the red, green and blue subpixels of each display pixel while the image frame is being displayed.

Figure 1:
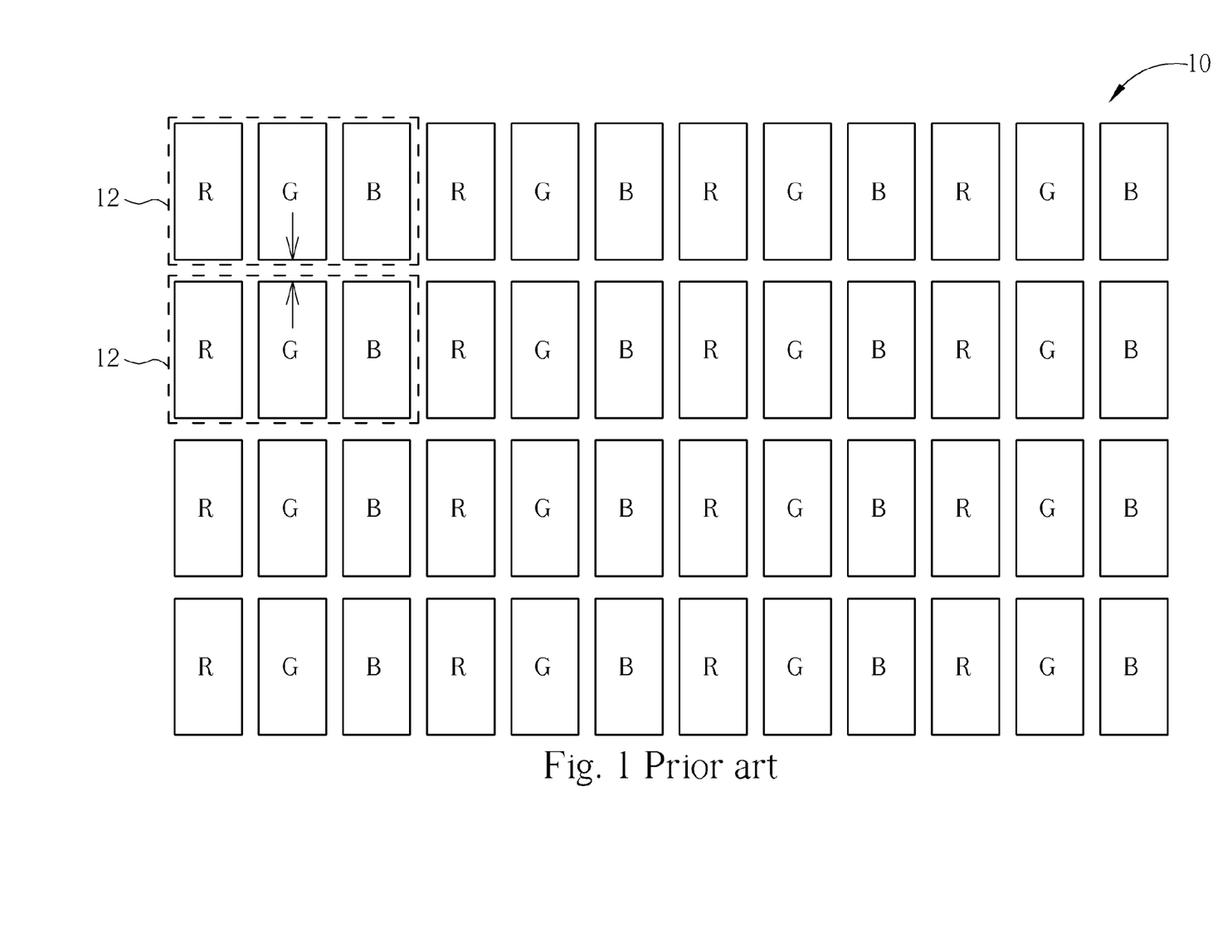
FIG. 1 is a schematic diagram of a stripe-shaped pixel structure according to the prior art.

A pixel structure of the electroluminescent display is an arrangement of the red, green and blue subpixels, and a resolution of the electroluminescent display is heavily influenced by a design of the pixel structure. Recently, the most popular pixel structure for use in the electroluminescent display is a stripe. Please refer to FIG. 1, which is a schematic diagram of a prior art stripe pixel structure. As shown in FIG. 1, the stripe pixel structure 10 comprises a plurality of red subpixels R, a plurality of green subpixels G, and a plurality of blue subpixels B, wherein the red subpixels R, the green subpixels G, and the blue subpixels B are arranged in respective stripe formations. In other words, each column of the stripe pixel structure 10 comprises subpixels of one color, and the columns are arranged in an order of red, green, then blue. The stripe pixel structure 10 comprises a plurality of display pixel units 12, and each display pixel unit 12 comprises a red subpixel R, a green subpixel G, and a blue subpixel B adjacent to each other and in a same row.

Figure 2:
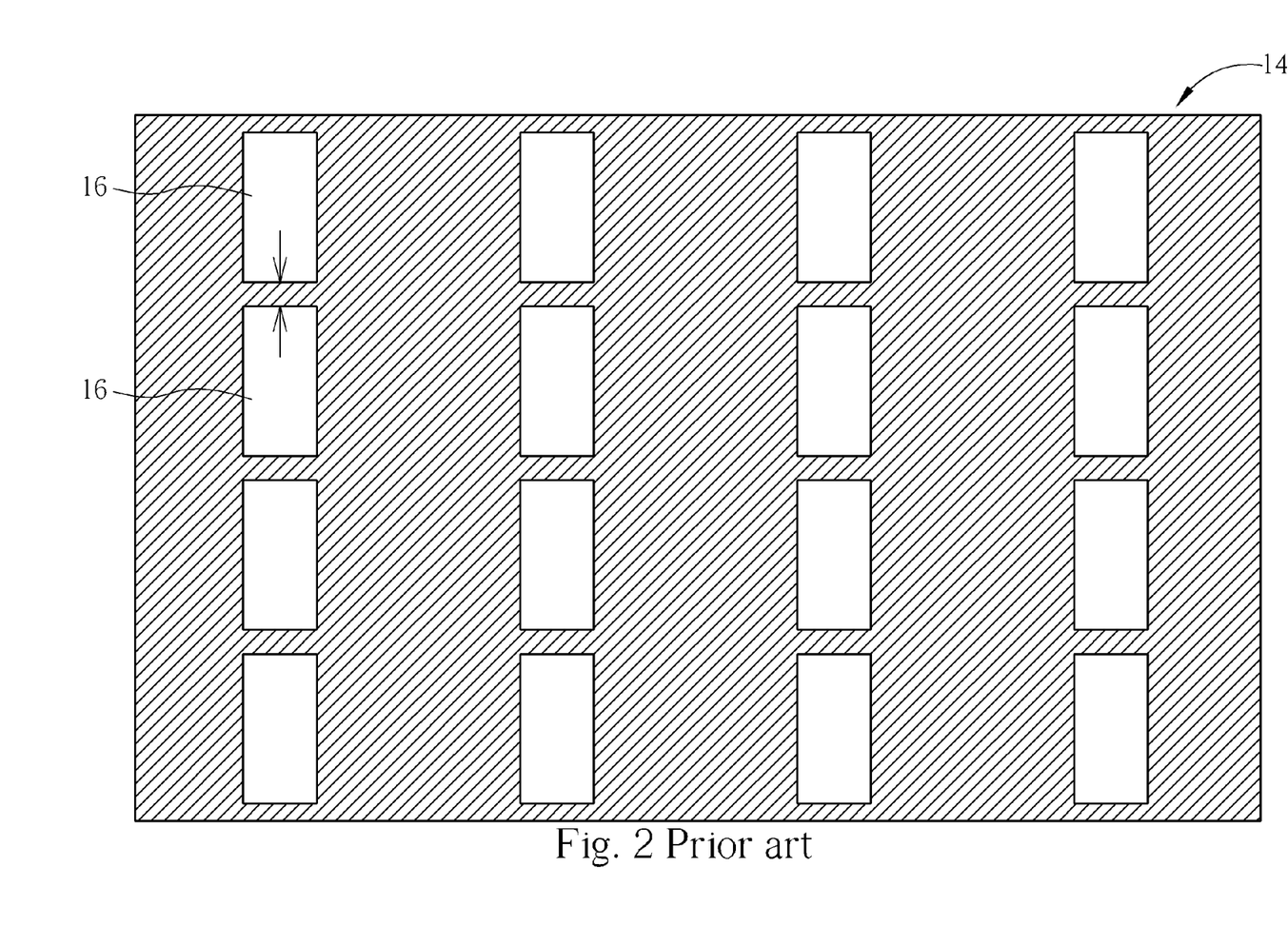
FIG. 2 is a schematic diagram of a shadow mask utilized to fabricate the stripe-shaped pixel structure of FIG. 1.

Although the pattern arrangement of the stripe pixel structure 10 is simple, a limitation exists when making a shadow mask used in an evaporation deposition process. Please refer to FIG. 2, which is a schematic diagram of the shadow mask utilized to make the stripe pixel structure of FIG. 1. As shown in FIG. 2, the shadow mask 14 comprises a plurality of rectangular openings 16, and each rectangular opening 16 corresponds to the plurality of subpixels of a single color, such as the plurality of red subpixels. However, because the shadow mask 14 is made of a metallic material, a gap between adjacent rectangular openings 16 must be sufficiently large (as indicated by an arrow of FIG. 1) to allow the shadow mask 14 to maintain structural strength, which establishes a lower limit on a density of the subpixels, affecting a maximum resolution achievable in the electroluminescent display.

Figure 3:
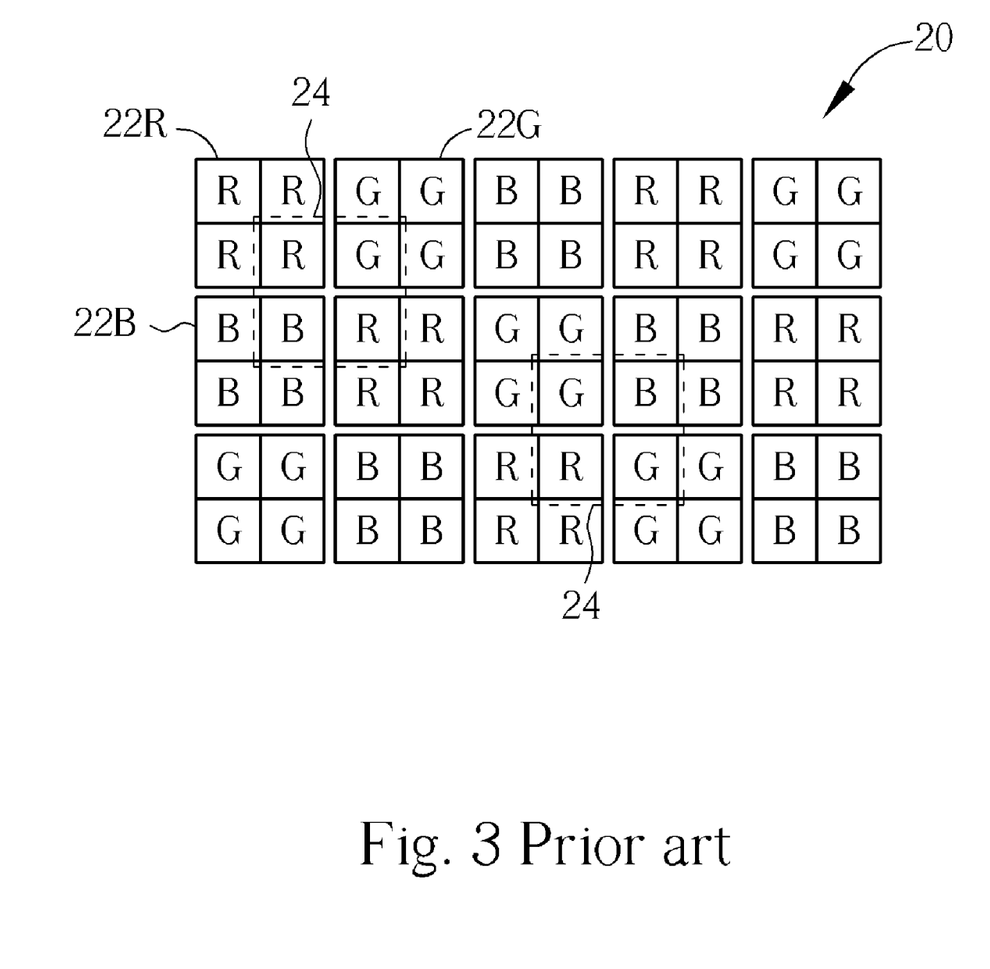
FIG. 3 is a schematic diagram of another pixel structure according to the prior art.

Please refer to FIG. 3, which is a schematic diagram of another prior art pixel structure 20. The pixel structure 20 comprises a plurality of red subpixel units 22R, a plurality of green subpixel units 22G and a plurality of blue subpixel units 22B, wherein each subpixel unit has four subpixels of a same color arranged in a matrix, and the red subpixel unit 22R, the green subpixel unit 22G and the blue subpixel unit 22B are arranged in an alternating formation, as shown in FIG. 3. A display pixel unit 24 of pixel structure 20 consists of four subpixels (represented by a dotted line) from four adjacent subpixel units, respectively. In other words, the display pixel unit 24 at least comprises a red subpixel R, a green subpixel G, and a blue subpixel B, and further comprises another subpixel that may be a red subpixel R, a green subpixel G, or a blue subpixel B.

Although the arrangement of FIG. 3 exhibits better color performance than the stripe pixel structure of FIG. 1, the resolution cannot be further increased because of process limitations. The pixel structure of the electroluminescent panel generally utilizes an evaporation deposition process with a shadow mask having different opening patterns to fabricate the red subpixel unit, the green subpixel unit, and the blue subpixel unit, respectively. However, the arrangement of the red subpixel unit 22R, the green subpixel unit 22G and the blue subpixel unit 22B in the pixel structure 20 will similarly encounter the process limitation of the evaporation deposition process.

Figure 4:
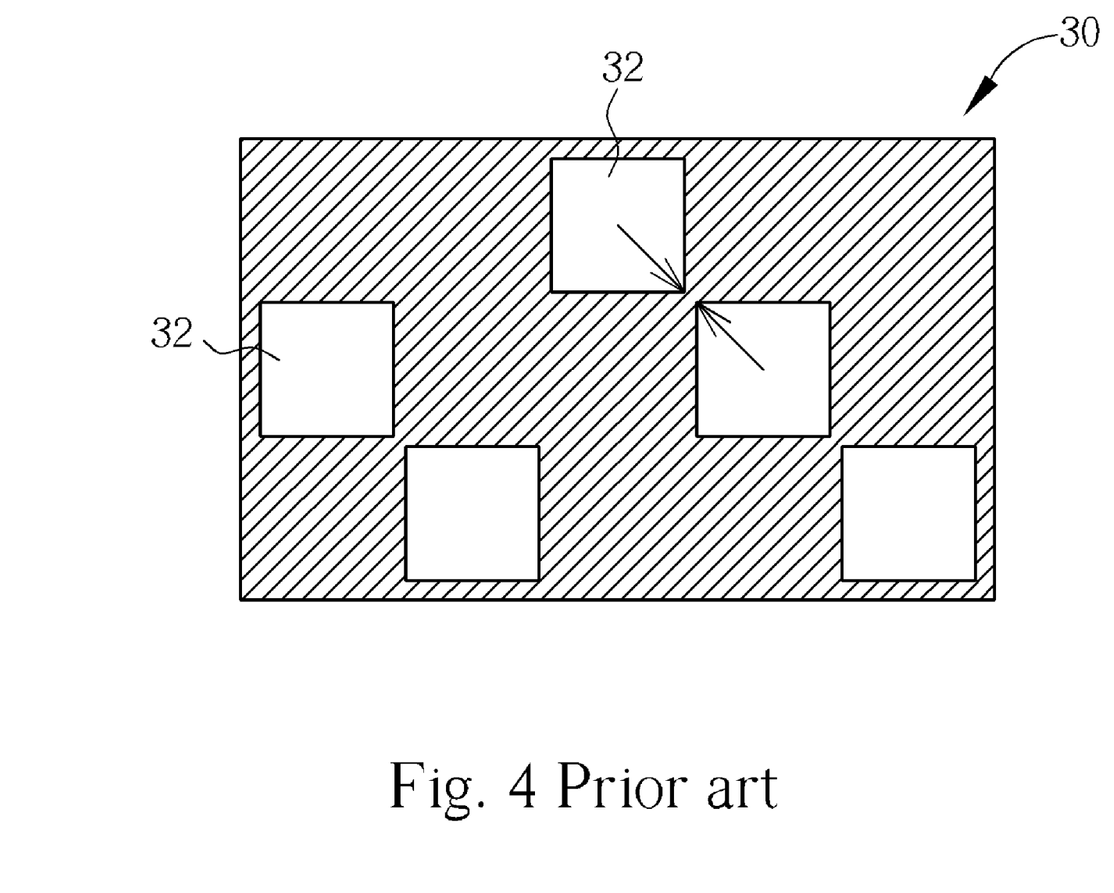
FIG. 4 is a schematic diagram of a shadow mask utilized to fabricate another pixel structure of FIG. 3.

Please refer to FIG. 4, which is a schematic diagram of the shadow mask used to fabricate the pixel structure 20 of FIG. 3. As shown in FIG. 4, the shadow mask 30 comprises a plurality of rectangular openings 32, and each rectangular opening 32 corresponds to the subpixel units of a single color, such as the red subpixel units. The subpixel unit can be deposited onto a substrate of the electroluminescent panel through use of the shadow mask 30 by evaporation. As mentioned above, because the shadow mask 30 is made of a metallic material, a distance between adjacent rectangular openings 32 must be sufficiently large (as shown by an arrow in FIG. 4) to maintain a structural strength of the shadow mask 30. Thus, a lower limit on a density of the subpixels will be unable to decrease, which affects a resolution of the display.

SUMMARY OF THE INVENTION

A pixel structure for use in an electroluminescent panel comprises a substrate and a plurality of display pixel units disposed on the substrate. Each display pixel unit comprises a first subpixel, a second subpixel, and a third subpixel. The first subpixel, the second subpixel, and the third subpixel are arranged in a delta formation. The first subpixel of each display pixel unit is adjacent to the first subpixels of two adjacent display pixel units. The second subpixel of each display pixel unit is adjacent to the second subpixels of two adjacent display pixel units. The third subpixel of each display pixel unit is adjacent to the third subpixels of two adjacent display pixel units.

A method of fabricating a pixel structure for use in an electroluminescent panel according to the present invention starts with providing a substrate. Then, a first shadow mask having a plurality of first openings patterned in an array of T shapes is provided. The first shadow mask is utilized to evaporate a plurality of first subpixel units comprising three first subpixels in a delta formation onto the substrate, each first subpixel unit corresponding to one of the plurality of first openings. Then, a second shadow mask having a plurality of second openings patterned in an array of T shapes is provided. The second shadow mask is utilized to evaporate a plurality of second subpixel units comprising three second subpixels in a delta formation onto the substrate, each second subpixel unit corresponding to one of the plurality of second openings and without overlapping the plurality of first subpixel units. A third shadow mask having a plurality of third openings patterned in an array of T shapes is provided. The third shadow mask is utilized to evaporate a plurality of third subpixel units comprising three third subpixels in a delta formation onto the substrate, each third subpixel unit corresponding to one of the plurality of third openings and without overlapping the plurality of first subpixel units or the plurality of second subpixel units. One first subpixel of the first subpixel unit, one second subpixel of the second subpixel unit adjacent to the first subpixel unit, and one third subpixel of the third subpixel unit adjacent to the first subpixel unit form a display pixel unit.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
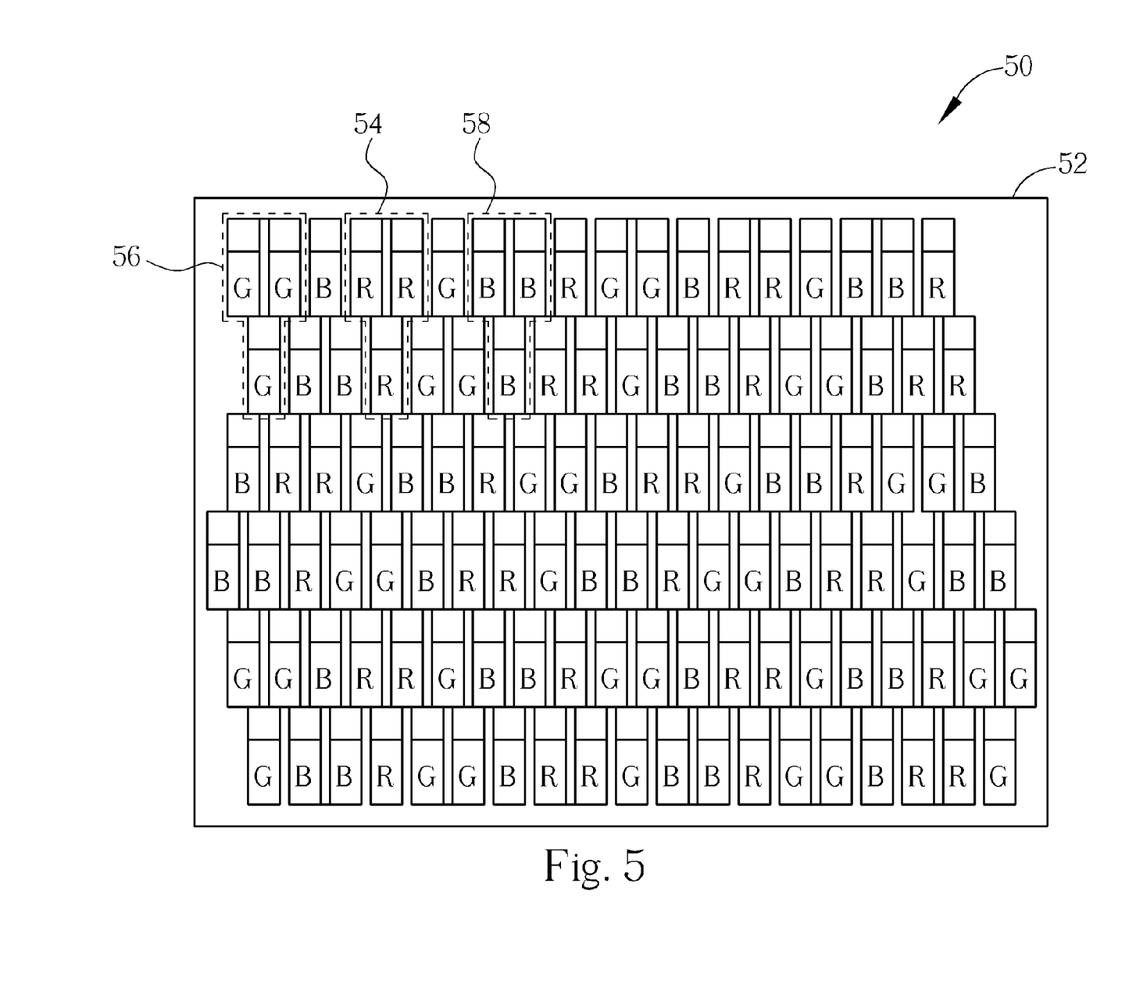
FIG. 5 is a schematic diagram of a pixel structure according to a preferred embodiment of the present invention.

Please refer to FIG. 5, which is a schematic diagram of a pixel structure for use in an electroluminescent panel according to a preferred embodiment of the present invention. As shown in FIG. 5, the pixel structure 50 comprises a substrate 52, a plurality of first subpixel units 54 disposed on the substrate 52, a plurality of second subpixel units 56 disposed on the substrate 52, and a plurality of third subpixel units 58 disposed on the substrate 52. In the preferred embodiment, the first subpixel units 54, the second subpixel units 56, and the third subpixel units 58 are red, green, and blue subpixel units, respectively, and therefore each first subpixel unit 54 comprises three first subpixels (red subpixels) R arranged in a delta formation, each second subpixel unit 56 comprises three second subpixels (green subpixels) G arranged in a delta formation, and each third subpixel unit 58 comprises three third subpixels (blue subpixels) B arranged in a delta formation.

In the pixel structure 50 of the preferred embodiment, the first subpixel unit 54, the second subpixel unit 56 and the third subpixel unit 58 are arranged in an alternating formation. As shown in FIG. 5, according to a direction of a row of subpixel units, the subpixel units disposed in each row are arranged in a repeating sequence of one first subpixel unit 54 followed by one second subpixel unit 56 followed by one third subpixel unit 58. In adjacent rows, the first subpixel unit 54, the second subpixel unit 56, and the third subpixel unit of a row are disposed in a mismatched arrangement relative to the first subpixel unit 54, the second subpixel unit 56 and the third subpixel unit 58 of an adjacent row. Further, any two adjacent subpixel units are upside-down relative to each other, such as an obverse triangle and a reverse triangle.

Figure 6:
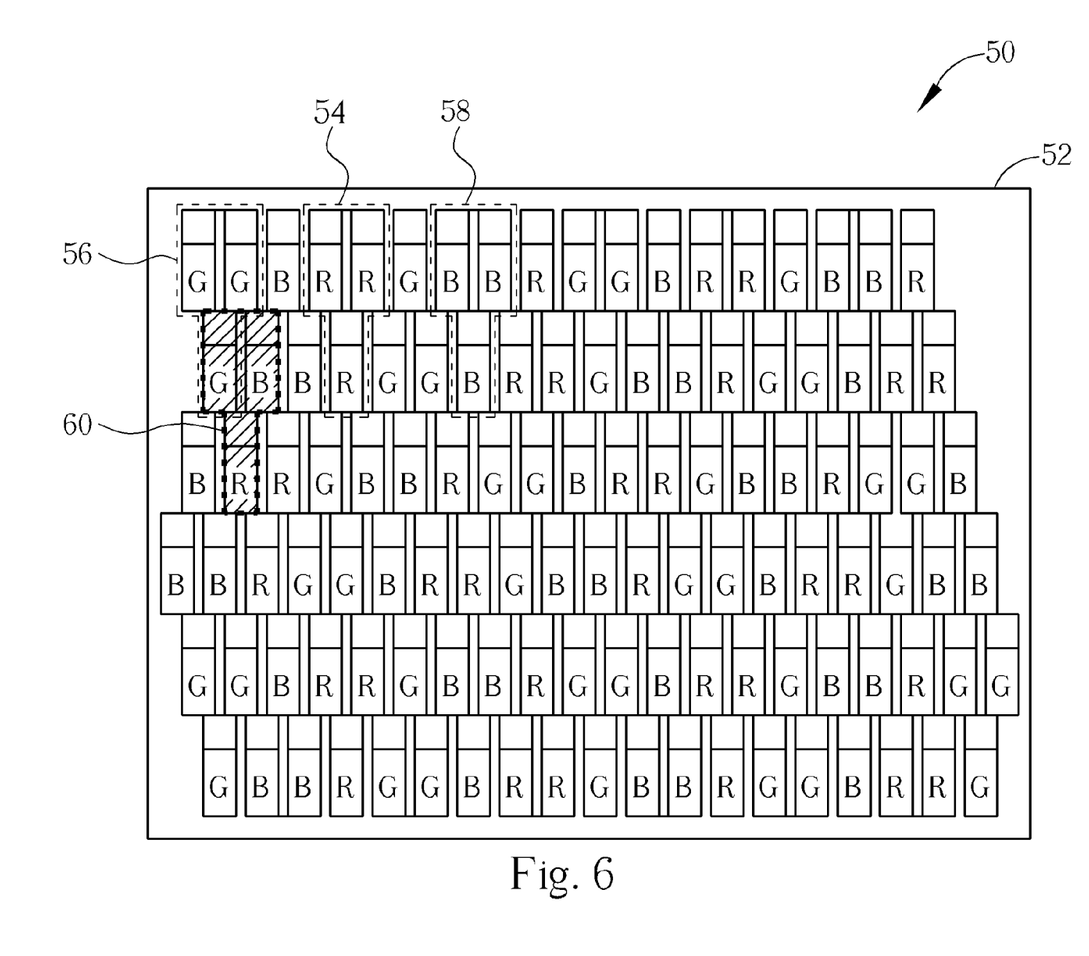
FIG. 6 is a schematic diagram of a display pixel unit of the pixel structure of FIG. 5.

FIG. 5 shows an arrangement of the subpixel units of the pixel structure 50, but the pixel structure 50 forms a display frame by combining display pixel units when displaying an image. Please refer to FIG. 6, which is a schematic diagram of the display pixel unit 60 of the pixel structure 50 shown in FIG. 5. As shown in FIG. 6, the pixel structure 50 comprises a plurality of display pixel units 60. Each display pixel unit 60 comprises a first subpixel R, a second subpixel G, and a third subpixel B. The first subpixel R, the second subpixel G, and the third subpixel B of each display pixel unit 60 respectively belong to one first subpixel unit 54, one second subpixel unit 56 and one third subpixel unit 58 that are adjacent to each other.

As can be seen in FIG. 6, a characteristic of a structure of the display pixel unit 60 of the preferred embodiment is that the first subpixel R of each display pixel unit 60 is next to the first subpixels R of two adjacent display pixel units 60, the second subpixel G of each display pixel unit 60 is next to the second subpixels G of two adjacent display pixel units 60, and the third subpixel B of each display pixel unit 60 is next to the third subpixels B of two adjacent display pixel units 60. Additionally, in each display pixel unit 60, the first subpixel R, the second subpixel G and the third subpixel B are arranged in a delta formation, such that each display pixel unit 60 forms a similar triangle structure. In addition, each display pixel unit 60 in a same row is oriented differently from an adjacent pixel unit in the same row. In other words, any two adjacent display pixel units 60 are upside-down (such as an obverse triangle and a reverse triangle) relative to each other.

Figure 7:
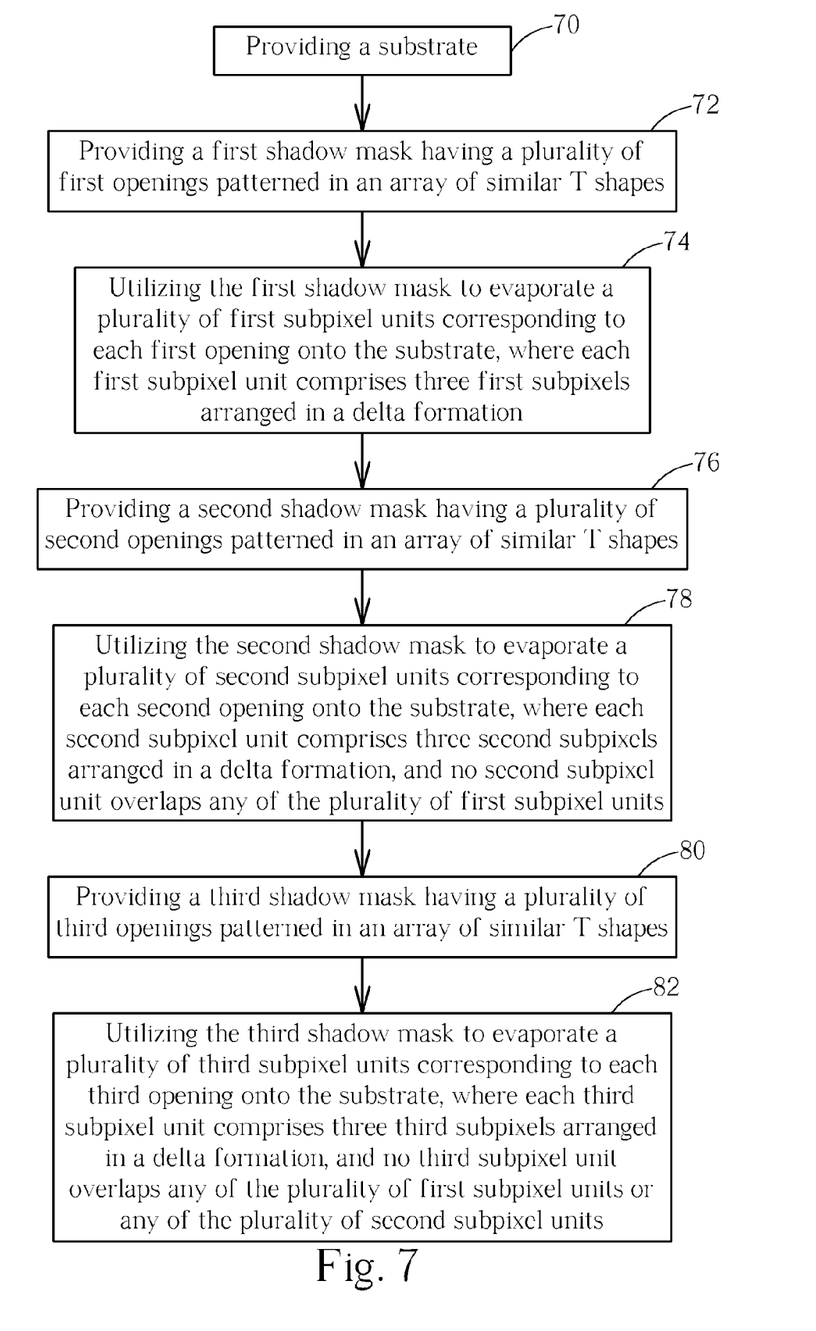
FIG. 7 is a flow chart of a method of fabricating a pixel structure according to the present invention.
Figure 8:
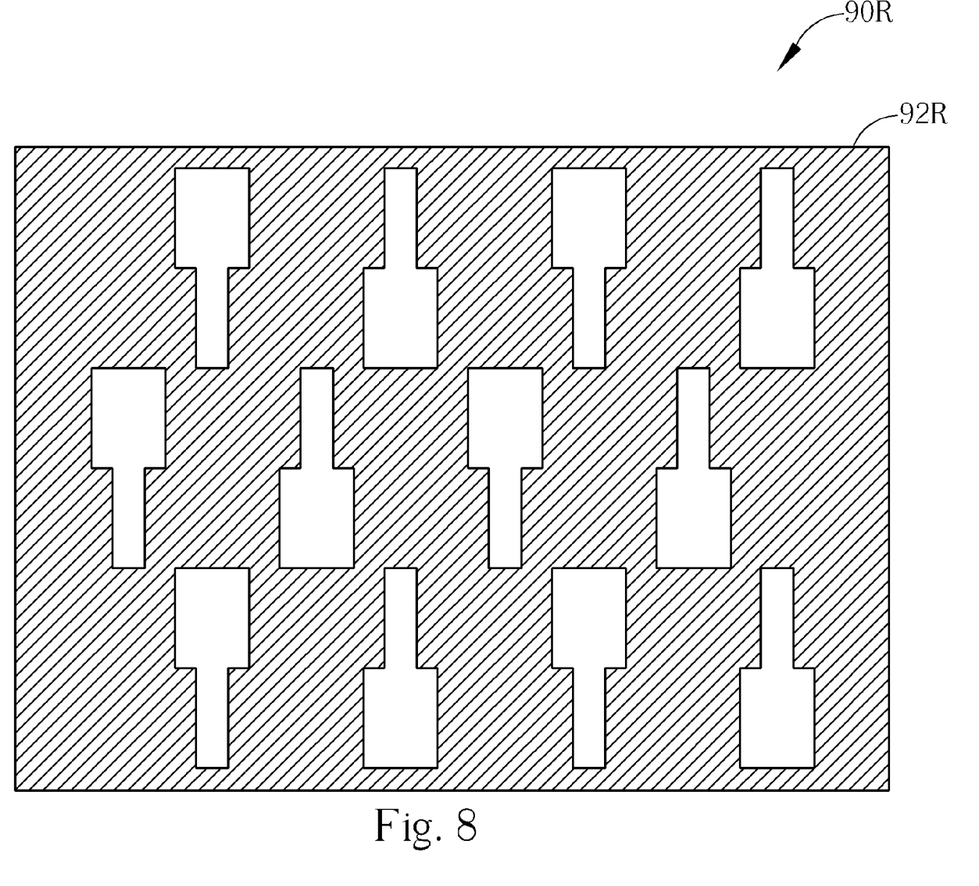
FIGS. 8 to 10 are schematic diagrams of shadow masks utilized to fabricate the pixel structure shown in FIG. 5 according to the present invention.
Figure 9:
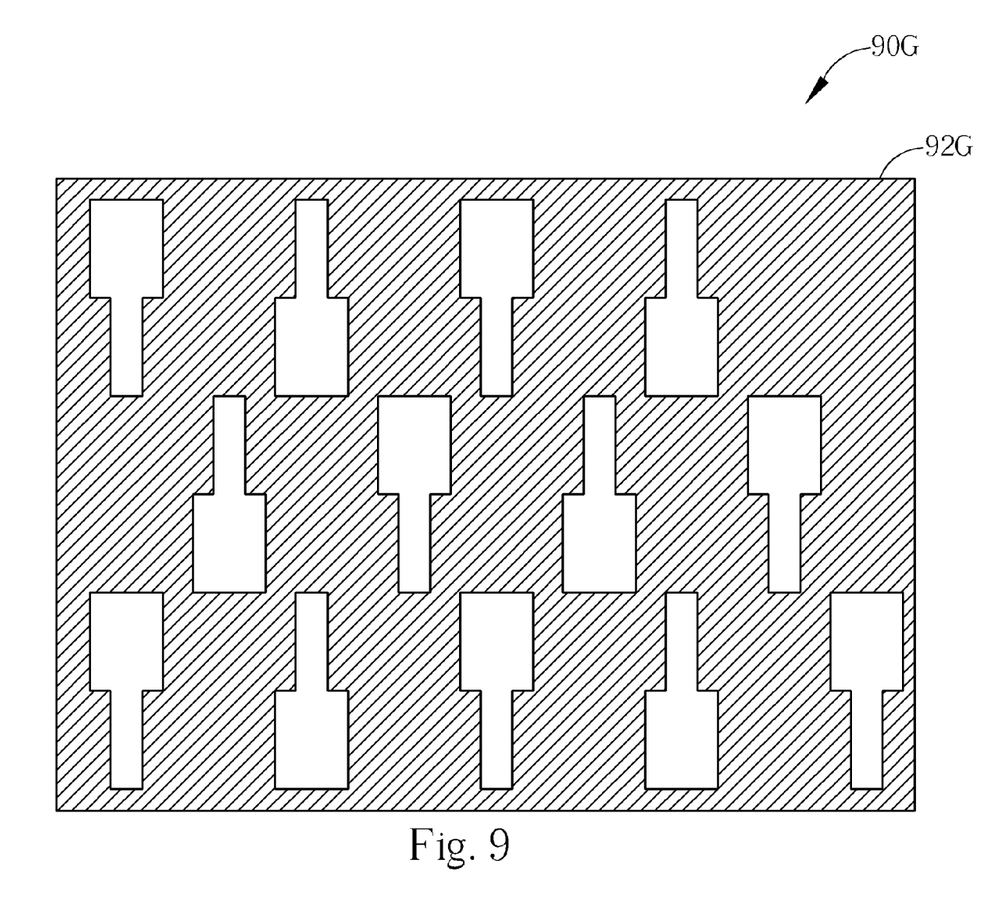
Figure 10:
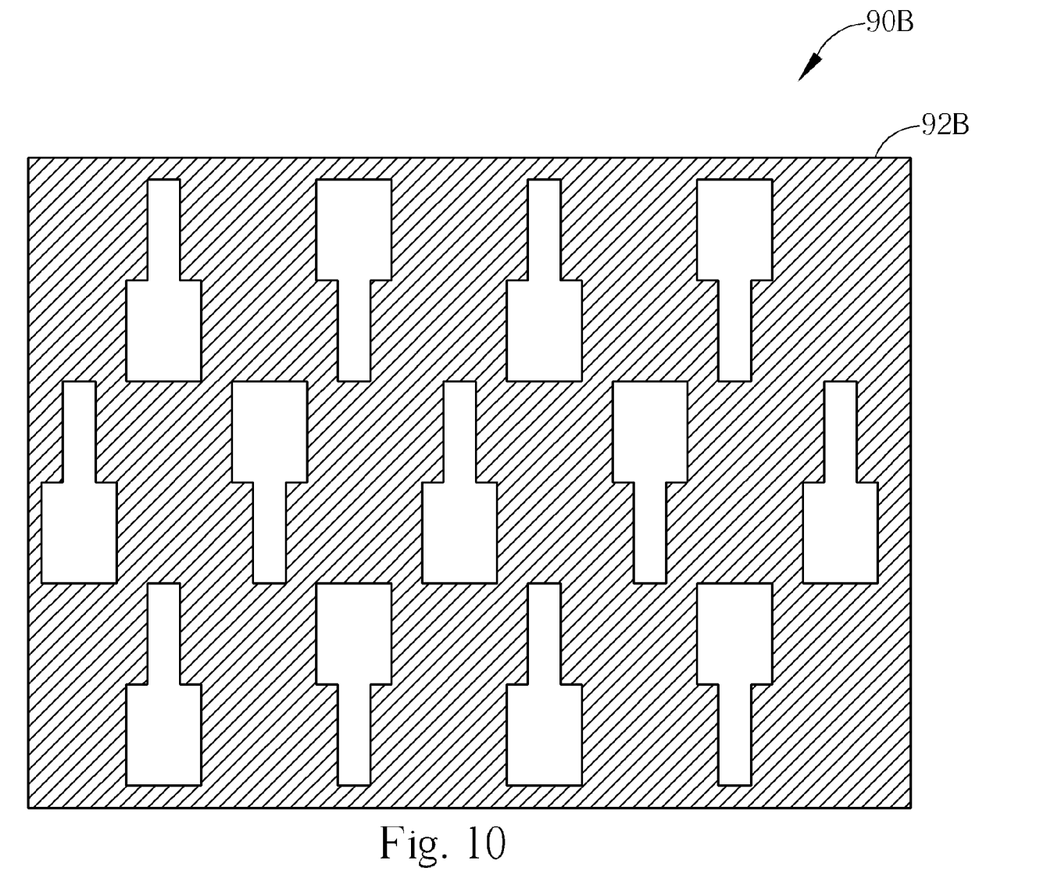

As designed, in the aforementioned display pixel unit 60, the first subpixel R, the second subpixel G, and the third subpixel B of each display pixel unit 60 are arranged in a delta formation, and the arrangement centralizes a distribution of the subpixels. Therefore, light is mixed more effectively, whereby display quality is improved. Additionally, due to the arrangement of the first pixel unit 54, the second pixel unit 56, and the third pixel unit 58, the limitations on the shadow mask mentioned above are overcome, and precision of the pixel structure is increased. Please refer to FIG. 7, which is a flow chart of the present invention method of fabricating the pixel structure for use in an electroluminescent panel. As shown in FIG. 7, the method comprises:

Step 70: Providing a substrate;

Step 72: Providing a first shadow mask having a plurality of first openings patterned in an array of similar T shapes;

Step 74: Utilizing the first shadow mask to evaporate a plurality of first subpixel units corresponding to each first opening onto the substrate, where each first subpixel unit comprises three first subpixels arranged in a delta formation;

Step 76: Providing a second shadow mask having a plurality of second openings patterned in an array of similar T shapes;

Step 78: Utilizing the second shadow mask to evaporate a plurality of second subpixel units corresponding to each second opening onto the substrate, where each second subpixel unit comprises three second subpixels arranged in a delta formation, and no second subpixel unit overlaps any of the plurality of first subpixel units;

Step 80: Providing a third shadow mask having a plurality of third openings patterned in an array of similar T shapes; and Step 82: Utilizing the third shadow mask to evaporate a plurality of third subpixel units corresponding to each third opening onto the substrate, where each third subpixel unit comprises three third subpixels arranged in a delta formation, and no third subpixel unit overlaps any of the plurality of first subpixel units or any of the plurality of second subpixel units;

By the aforementioned steps, the pixel structure can be formed on the substrate. The display pixel unit of the pixel structure comprises one first subpixel of each first subpixel unit, one second subpixel of one second subpixel unit adjacent to the first subpixel unit, and one third subpixel of one third subpixel unit adjacent to the first subpixel unit. Please refer to FIGS. 8-10, which are diagrams of the shadow mask used to fabricate the pixel structure shown in FIG. 5 according to the present invention. FIG. 8 is a schematic diagram of the first shadow mask, FIG. 9 is a schematic diagram of the second shadow mask, and FIG. 10 is a schematic diagram of the third shadow mask. As shown in FIGS. 8-10, the first shadow mask 90R comprises a plurality of first openings 92R patterned in an array of similar T shapes. Each first opening 92R in a same row is oriented differently from an adjacent first opening in the same row. The second shadow mask 90G comprises a plurality of second openings 92G patterned in an array of similar T shapes. Each second opening 92G in a same row oriented differently from an adjacent second opening in the same row. The third shadow mask 90B comprises a plurality of third openings 92B patterned in an array of similar T shapes. Each third opening 92B in a same row oriented differently from an adjacent third opening in the same row.

Arrangements of openings in the first shadow mask 90R, the second shadow mask 90G, and the third shadow mask 90B are similar, a difference being that the arrangement of openings in each shadow mask is offset from the arrangement of openings in each other shadow mask. The arrangement of openings in the shadow mask increases a distance between each opening, so that production of the shadow mask does not face the above mentioned process limitation arising due to the consideration of the structural strength of the shadow mask. As can be seen from FIGS. 8-10, for the first shadow mask 90R, the second shadow mask 90G, and the third shadow mask 90B, the distance separating each of the plurality of first openings 92R, the distance separating each of the plurality of second openings 92G, and the distance separating each of the plurality of third openings 92B are all far over the process limitation. By utilizing the first shadow mask 90R, the second shadow mask 90G, and the third shadow mask 90B in order in the evaporation deposition process, the pixel structure shown in FIG. 5 can be fabricated. In such a way, although the distance separating the first openings 92R, the distance separating the second openings 92G, and the distance separating the third openings 92B are respectively bigger than the distances separating subpixels of the prior art, when the shadow masks are combined, the pixel structure has smaller distances between subpixels, which effectively increases resolution.

By utilizing the pixel structure design and the method according to the present invention, the resolution of electroluminescent panel can be increased effectively. It is worthy of note that the pixel structure of the present invention can be applied to all kinds of full color display panels, such as OLED display panels or polymer light emitting diode (PLED) display panels. Therefore, depending on different display panel types, each subpixel can comprise an organic light emitting diode or a polymer light emitting diode to effectively increase resolution while still following the spirit of the pixel structure design of the present invention.

In summary, to improve a thin-film transistor display panel fabrication process, the pixel structure of the present invention and method of making the same can overcome the evaporation deposition process limitation to increase the precision of subpixel fabrication, exceeding 200 ppi in practice. Therefore, the evaporation deposition process is removed as a bottleneck for increasing resolution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a pixel structure for use in an electroluminescent panel, comprising:
   providing a substrate;
   providing a first shadow mask having a plurality of first openings patterned in an array of T shapes;
   evaporating a plurality of first subpixel units through the first shadow mask, each of the plurality of first subpixel units corresponding to one of the plurality of first openings and comprising three first subpixels in a delta formation;
   providing a second shadow mask having a plurality of second openings patterned in an array of T shapes;
   evaporating a plurality of second subpixel units through the second shadow mask, each of the plurality of second subpixel units corresponding to one of the plurality of second openings and without overlapping the plurality of first subpixel units, and each of the plurality of second subpixel units comprising three second subpixels in a delta formation;
   providing a third shadow mask having a plurality of third openings patterned in an array of T shapes; and
   evaporating a plurality of third subpixel units through the third shadow mask, each of the plurality of third subpixel units corresponding to one of the plurality of third openings and without overlapping the plurality of first subpixel units and the plurality of second subpixel units, and each of the plurality of third subpixel units comprising three third subpixels in a delta formation;
   wherein one first subpixel of the first subpixel unit, one second subpixel of the second subpixel unit adjacent to the first subpixel unit, and one third subpixel of the third subpixel unit adjacent to the first subpixel unit form a display pixel unit.

2. The method of claim 1, wherein each display pixel unit is T-shaped, and the first subpixel, the second subpixel, and the third subpixel of each display pixel unit are arranged in a delta formation.

3. The method of claim 1, wherein the first subpixel is a red subpixel, the second subpixel is a green subpixel, and the third subpixel is a blue subpixel.

4. A method of fabricating a pixel structure for use in an electroluminescent panel, comprising:
   providing a substrate;
   providing a first shadow mask having a plurality of first openings, wherein each of the first openings has a T shape;
   evaporating a plurality of first subpixel units through the first shadow mask, each of the plurality of first subpixel units corresponding to one of the plurality of first openings and comprising three first subpixels in a delta formation;
   providing a second shadow mask having a plurality of second openings, wherein each of the second openings has a T shape;
   evaporating a plurality of second subpixel units through the second shadow mask, each of the plurality of second subpixel units corresponding to one of the plurality of second openings and without overlapping the plurality of first subpixel units, and each of the plurality of second subpixel units comprising three second subpixels in a delta formation;

providing a third shadow mask having a plurality of third openings, wherein each of the third openings has a T shape; and evaporating a plurality of third subpixel units through the third shadow mask, each of the plurality of third subpixel units corresponding to one of the plurality of third openings and without overlapping the plurality of first subpixel units and the plurality of second subpixel units, and each of the plurality of third subpixel units comprising three third subpixels in a delta formation;

wherein one first subpixel of the first subpixel unit, one second subpixel of the second subpixel unit adjacent to the first subpixel unit, and one third subpixel of the third subpixel unit adjacent to the first subpixel unit form a display pixel unit.

* * * * *